United States Patent [19]

Kinoshita et al.

[11] Patent Number: 4,688,065
[45] Date of Patent: Aug. 18, 1987

[54] MOS TYPE SEMICONDUCTOR DEVICE

[75] Inventors: Hiroyuki Kinoshita, Tokyo; Michihiro Ono, Kawasaki, both of Japan

[73] Assignee: Tokyo Shibaura Denki Kabushiki Kaisha, Kawasaki, Japan

[21] Appl. No.: 903,844

[22] Filed: Sep. 4, 1986

Related U.S. Application Data

[63] Continuation of Ser. No. 550,047, Nov. 9, 1983, abandoned.

[30] Foreign Application Priority Data

Nov. 11, 1982 [JP] Japan .................. 57-198191

[51] Int. Cl.⁴ .......................................... H01L 29/78
[52] U.S. Cl. ............... 357/23.13; 357/23.14; 357/13; 307/200 B
[58] Field of Search ............ 357/23.13, 23.6, 23.14, 357/13; 307/200 B

[56] References Cited

U.S. PATENT DOCUMENTS

| | | | |
|---|---|---|---|
| 3,403,270 | 9/1968 | Pace et al. ................ | 357/23.13 |
| 3,407,339 | 10/1968 | Booher ........................ | 357/23.13 |
| 3,413,497 | 11/1968 | Atalla ........................... | 357/23.13 |
| 3,555,374 | 1/1971 | Usuda ........................... | 357/23.13 |
| 3,601,625 | 8/1981 | Redwine ...................... | 357/23.13 |
| 3,967,295 | 6/1976 | Stewart ........................ | 357/23.13 |
| 4,044,373 | 8/1977 | Nomiya ........................ | 357/23.13 |
| 4,143,391 | 3/1979 | Suzuki ......................... | 357/440 R |
| 4,264,941 | 4/1981 | London ......................... | 357/42 |
| 4,356,502 | 10/1982 | Yamada ........................ | 357/23.13 |

FOREIGN PATENT DOCUMENTS

| | | |
|---|---|---|
| 2559360 | 10/1976 | Fed. Rep. of Germany . |
| 43-455B | 1/1943 | Japan . |
| 45-34641B | 1/1970 | Japan . |
| 52-33472B | 8/1977 | Japan . |
| 53-39085 | 4/1978 | Japan ............... 357/23.13 |
| 54-149479 | 11/1979 | Japan ............... 357/23.13 |
| 56-150865 | 11/1981 | Japan ............... 357/23.13 |

OTHER PUBLICATIONS

Patents Abstracts of Japan vol. 6, No. 151, Aug. 11, 1982 and JP-A-57-72376.

*Primary Examiner*—Martin H. Edlow
*Attorney, Agent, or Firm*—Finnegan, Henderson, Farabow, Garrett & Dunner

[57] ABSTRACT

A MOS type semiconductor device with a gate protecting circuit for protecting an internal circuit is disclosed. Distance between the input section diffusion layer in the gate protecting circuit and the diffusion layers in the internal circuit is selected at such values that minority carriers derived from the diffusion layer in the internal circuit are prevented from reaching a depletion layer in the gate protecting circuit which is caused by the impression thereto of a surge voltage, and are also selected to at least ten times a predetermined minimum distance each separating the adjacent diffusion layers of those.

18 Claims, 8 Drawing Figures

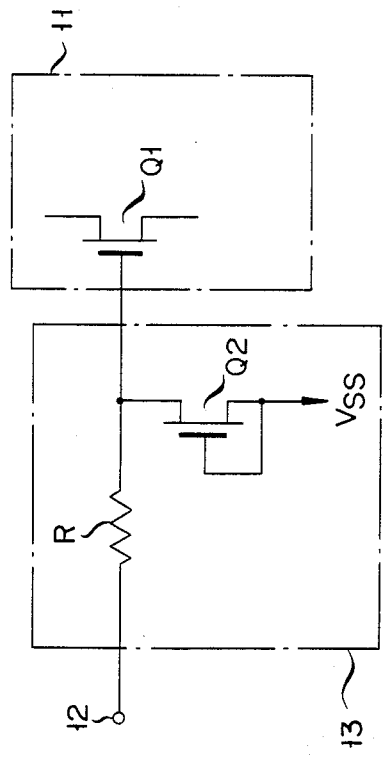
F I G. 1
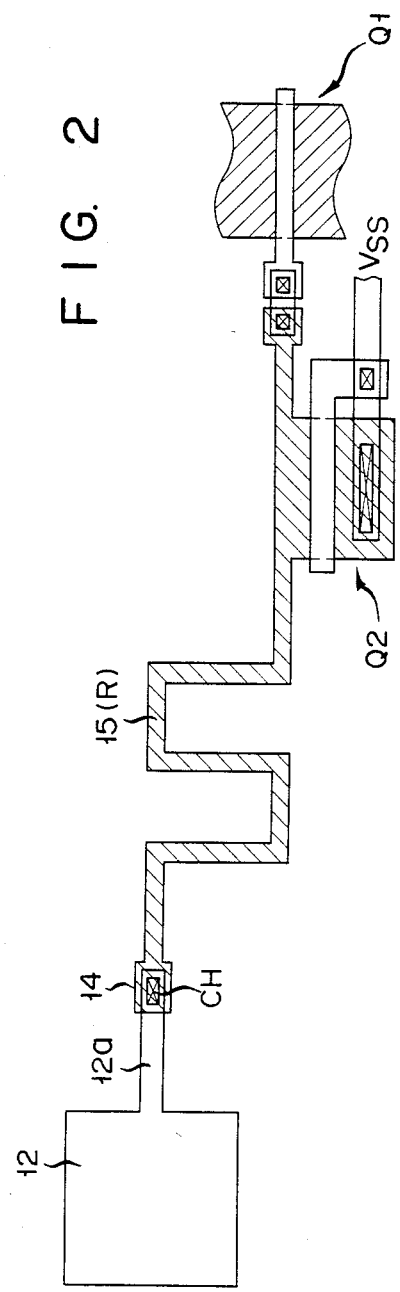
F I G. 2

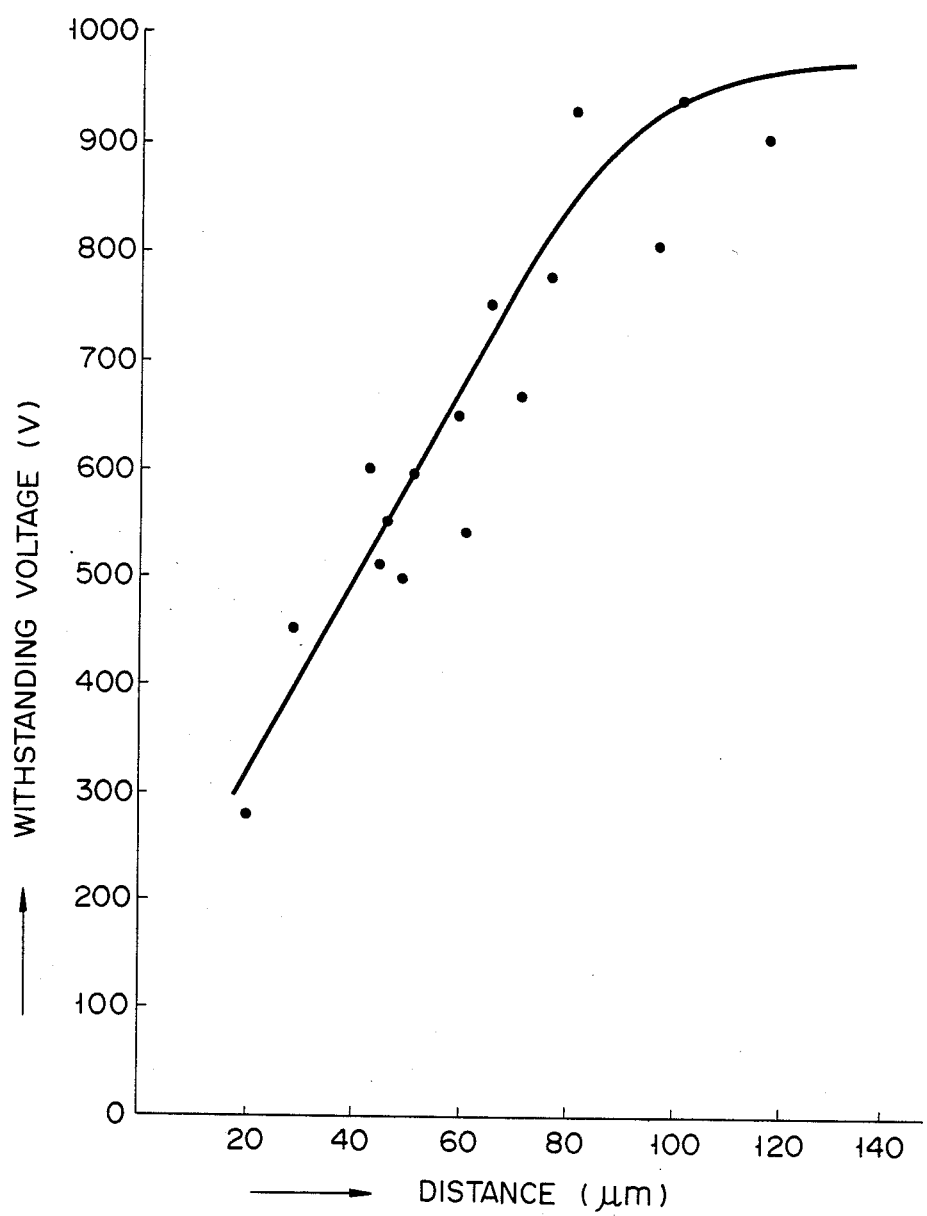

MOS TYPE SEMICONDUCTOR DEVICE

This application is a continuation, of application Ser. No. 550,047, filed Nov. 9, 1983, now abandoned.

BACKGROUND OF THE INVENTION

The present invention relates to a MOS (metal oxide semiconductor) type semiconductor device with a gate protecting circuit for protecting an internal circuit.

A MOS type semiconductor device containing a MOS FET (metal oxide semiconductor field effect transistor) typically has a low withstanding voltage (that is, the ability to withstand a static discharge) normally in the range of 20 V–100 V, because the input impedance of the MOS FET is extremely high and the thickness of the gate insulation film is thin, typically 400 Å to 1000 Å. For this reason, the gate insulation film is easily destroyed by static electricity generated by friction and the like. To protect the gate insulation film from destruction by static electricity, the typical MOS type semiconductor device is provided with a gate film protecting circuit.

The basic construction of a MOS type semiconductor device with the gate film protecting circuit will be described referring to FIG. 1. A MOS FET Q1 constitutes a part of internal circuit 11. A resistor R made of an impurity diffusion layer is inserted between the gate of the MOS FET Q1 and the input terminal (bonding pad) 12. A MOS FET Q2 is connected between the gate of the MOS FET Q1 and a low potential power source $V_{SS}$. The gate of the MOS FET Q2 is connected to the power source $V_{SS}$. The resistor R and the MOS FET Q2 constitute a gate film protecting circuit 13.

In this circuit, when an over-voltage with a sharp pulse waveform, such as a surge voltage, is applied to the input terminal, the over-voltage passes through the resistor R. The over-voltage is then clamped by the break down or foward bias characteristics of the PN junction located between the resistor R and the semiconductor substrate and the waveform is smoothed by the resistivity of the resistor R. The high voltage then enters the diffusion layer of the MOS FET Q2 where its amplitude is reduced through action of the low potential power source $V_{SS}$ being applied to the gate electrode of the MOS FET Q2, which causes the electric field at the surface of the substrate to increase and thus to reduce the over-voltage. In this way, the amplitude-reduced voltage is applied to the input section of the internal circuit 11, more exactly the gate of the MOS FET Q1, and the internal circuit is protected from the extremely high over-voltage.

FIG. 2 shows a pattern diagram of the circuit shown in FIG. 1. In FIG. 2, a wiring layer 12a made of aluminum, for example, connects the bonding pad 12, the input terminal, and an impurity diffusion layer which constitutes a protecting resistive layer 15. An input diffusion layer 14 with a contact hole CH provides a contact between the wiring layer 12a and the protecting resistive layer 15. The resistive layer 15, with resistance of approximately 500 ohms to several kilohms, provides a time constant from 1 ns to 5 ns for passing the over-voltage. With this time constant, the waveform of the over-voltage is made smoother, i.e., sharp peaks are reduced.

With advances in the microfabrication technique of manufacturing integrated circuits, the thickness of the gate insulation film has become thinner and the depth of the diffusion layer has become shallower. Because of these reductions, the gate protecting circuit is easily defeated by a relatively small surge voltage. Thus, the internal circuit is unsatisfactorily protected from the over-voltage.

SUMMARY OF THE INVENTION

Accordingly, an object of the present invention is to provide a microfabricated MOS type semiconductor device with a gate protecting circuit which can protect the internal circuit from a large surge voltage.

According to the invention, there is provided a MOS type semiconductor device having a gate protecting circuit including an impurity diffusion layer which includes an input section diffusion layer; a circuit other than the gate protecting circuit including, at least, a plurality of impurity diffusion layers having therebetween a first distance equal to or larger than a predetermined minimum distance; the input section layer of the gate protecting circuit being located a second distance from the diffusion layers of the other circuit, the second distance being ten or more times the predetermined minimum distance.

According to the invention, there is further provided a MOS type semiconductor device comprising a plurality of gate protecting circuits having impurity diffusion layers which include input section diffusion layers; an internal circuit whose input portions are proteted by the gate protecting circuits; the internal circuit including a plurality of impurity diffusion layers having therebetween a first distance equal to or larger than a predetermined minimum distance, and the distances between the input section layers of the gate protecting circuts and the diffusion layers of the internal circuit being a second distance ten or more times the predetermined minimum distance.

BRIEF DESCRIPTION OF THE DRAWINGS

FIG. 1 shows a circuit diagram of a basic arrangement of a MOS type semiconductor device with a gate protecting circuit;

FIG. 2 shows a pattern diagram of a conventional MOS type semiconductor device of the circuit of FIG. 1;

FIG. 8 is a graphical representation of a relationship of the withstanding voltage of the MOS type semiconductor device vs. the distance between the diffusion layers of the internal circuit and the gate protecting circuit.

DETAILED DESCRIPTION OF THE PREFERRED EMBODIMENT

Many solutions have been proposed to prevent the destruction of the gate protecting circuit of a MOS during an over-voltage. Because the mechanism, or manner, of the circuit destruction was unknown, those solutions proved to be unsatisfactory. In particular, no consideration was given to the distance between the diffusion layers of the gate protecting circuit and the internal circuit. The inventors of the present patent application carefully studied the problem and succeeded in understanding the mechanism of the circuit breakdown. The present invention is based on the result of their study.

Figure 3:
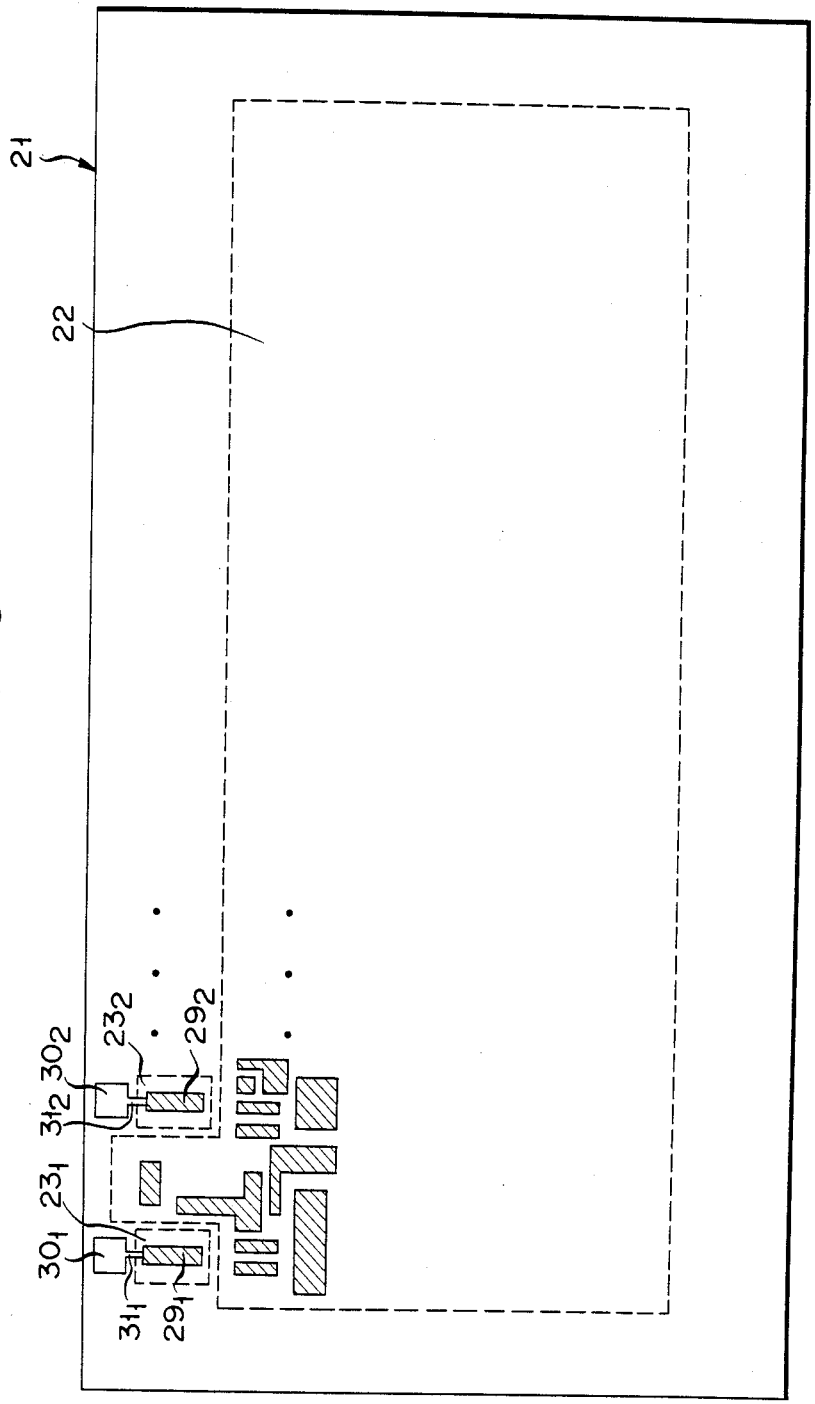
FIG. 3 shows a pattern diagram schematically illustrating an embodiment of a MOS type semiconductor device according to the present invention.
Figure 4:
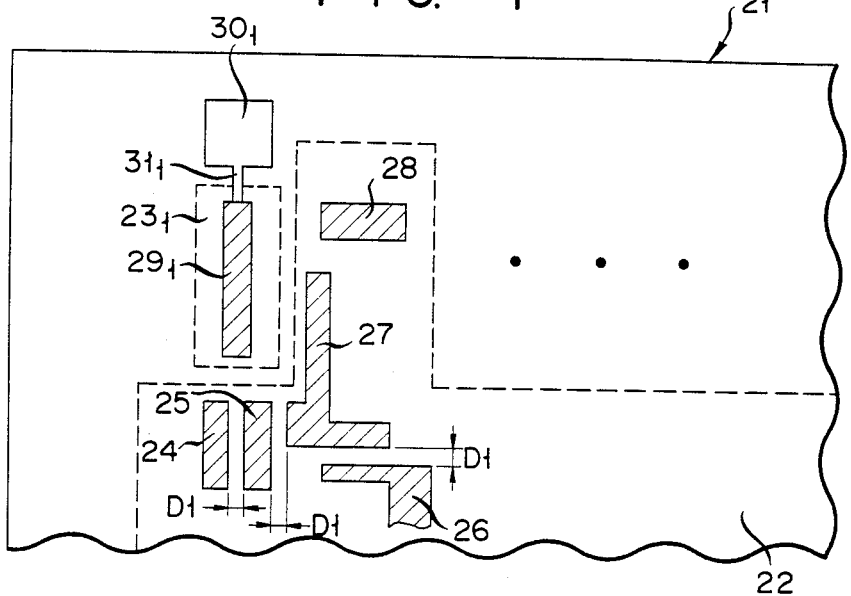
FIG. 4 shows an enlarged view of a part of the pattern of FIG. 3.

FIG. 3 schematically illustrates a pattern of an embodiment of a MOS type semiconductor device constructed according to the present invention. FIG. 4 illustrates the details of an internal circuit 22 and a gate protecting circuit 23, in the pattern shown in FIG. 3. A semiconductor chip 21 bears an internal circuit 22 containing MOS FETs and a plurality of gate protecting circuits $23_1$, $23_2$, . . . formed on the periphery of the internal circuit 22. In FIG. 3, only two gate protecting circuits are illustrated, for simplicity of illustration. The diffusion layers 24, 25, 27 in the internal circuit 22 (see FIG. 4) are arranged separated from each other by a minimum distance D1, as determined by the microfabrication manufacturing technique employed and the circuit design.

The gate protecting circuits $23_1$, $23_2$, . . . contain respectively impurity diffusion layers $29_1$, $29_2$, . . . forming the protecting resistors. The input terminals (bonding pads) $30_1$, $30_2$, . . . are provided on the periphery of the chip 21. The input terminals $30_1$, $30_2$, . . . are connected to gate protecting circuits $23_1$, $23_2$, . . . by means of wiring layers $31_1$, $31_2$, . . . , respectively. Distances from the diffusion layer $29_1$ of the gate protecting circuit $23_1$ to the diffusion layers 24 to 28 of the internal circuit 22 are selected to be such that minority carriers emitted from the diffusion layers 24 to 28 to the semiconductor substrate do not reach the depletion layer of the diffusion layer $29_1$ in the protecting circuit $23_1$. That depletion layer is caused when a surge voltage is applied to protecting circuit 23. Those distances, i.e., between diffusion layer $29_1$ and diffusion layers 24 to 28, are also selected to be ten times or more the minimum distance between the adjacent diffusion layers 24 to 28. Though not exactly shown in FIGS. 3 and 4, this relationship is maintained for the distances between diffusion layers 24 to 28 of the internal circuit 22 and the diffusion layer $29_2$, . . . of other gate protecting circuits $23_2$, . . . and applied for the distance between the diffusion layers $29_1$, $29_2$, . . . of adjacent gate protecting circuits $23_1$, $23_2$, . . .

Figure 5:
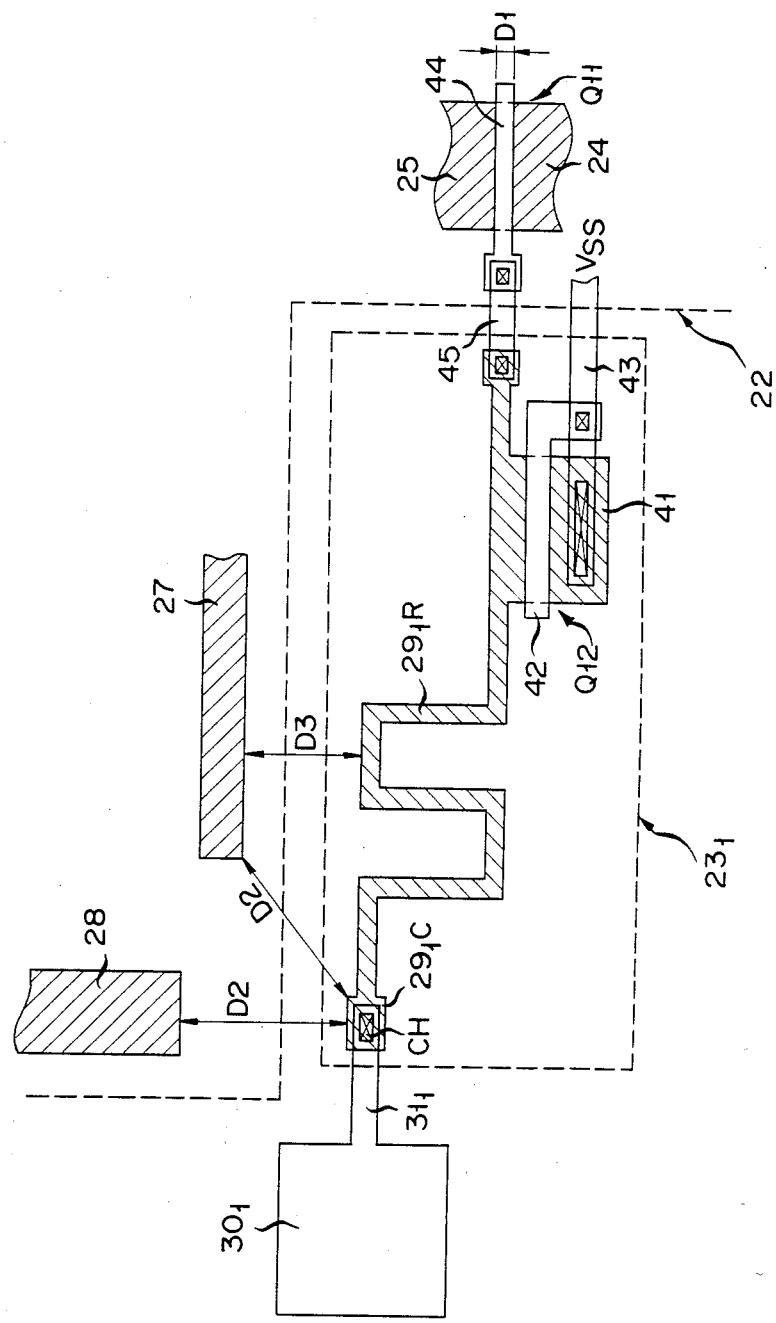
FIG. 5 shows a pattern diagram illustrating in detail a part of the pattern shown in FIGS. 3 and 4.

Additional details of the patterns of the diffusion layers 24, 25, 27 and 28 of the internal circuit 22 and the gate protecting circuit $23_1$ associated therewith are illustrated in FIG. 5.

As shown there, the diffusion layer $29_1$ of the gate protecting circuit $23_1$ contains a contact diffusion layer $29_1$C for making contact with the input section and a diffusion layer $29_1$R as a resistive layer. The contact diffusion layer $29_1$C is connected to the bonding pad $30_1$, through a contact hole CH by way of a wiring layer $31_1$.

The gate protecting circuit $23_1$ further contains an impurity diffusion layer 41. A gate electrode 42 made of polysilicon, for example, is formed on the semiconductor chip 21 between the resistive layer $29_1$R and the diffusion layer 41, through a gate insulation film (not shown), for example, an $SiO_2$ film. Thus a MOS FET Q12 is formed. An electrode layer 43, made of aluminum, for example, is connected to the diffusion layer 41 through a contact hole. The electrodes 42 and 43 are both conected to the power source $V_{SS}$. A second gate electrode 44 made of polysilicon, for example, is formed on the semiconductor chip 21 between the diffusion layers 24 and 25 of the internal circuit 22 through a gate insulation film. The diffusion layers 24, 25 and gate electrode 44 constitute an input MOS FET Q11. The resistive diffusion layer $29_1$R of the gate protecting circuit $23_1$ and the gate electrode 44 of the input MOS FET Q11 of the internal circuit 22 are interconnected to each other by a wiring layer 45 made of aluminum, for example, through contact holes.

Figure 6:
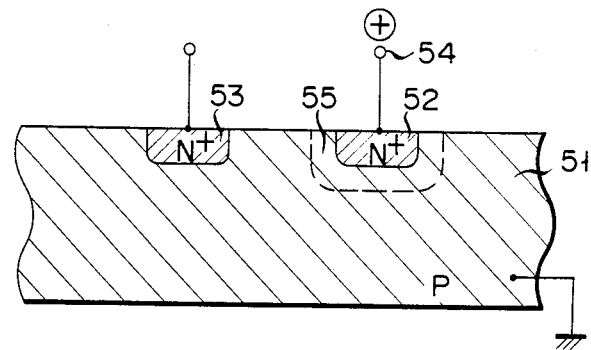
FIG. 6 shows a cross sectional view of a MOS type semiconductor device containing a diffusion layer of the internal circuit and a gate protecting circuit.

A description of the gate protecting circuit being destroyed by an incoming surge voltage will be described referring to FIG. 6. In FIG. 6, which illustrates a cross section of a MOS type semiconductor device with a gate protecting circuit, a P type silicon substrate 51 is grounded. Two N+ diffusion regions 52 and 53 with high impurity are formed in the major surface regions of the substrate 51. The region 52 is the diffusion layer (typically, an input section i.e., a connecting diffusion layer to a wiring layer extending from a bonding pad) of the gate protecting circuit. The region 53 is the diffusion layer of the internal circuit or adjacent gate protecting circuit. The region 52 is connected to an input terminal 54.

In operation, when a positive surge voltage is applied to the input terminal 54, the diffusion layer 52 is inversely biased or reverse-biased and destroyed, so that a large current flows into the ground point of the substrate 51. When this happens, a voltage near the diffusion layer 52 rises due to the resistance of the substrate 51. When the diffusion layer 52 in the protecting circuit is located close to the diffusion layer 53 in the internal circuit, the diffusion layer 53 will be biased forwardly, or forward-biased, due to this voltage. Therefore, if the diffusion layer 53 is biased to a fixed potential or its capacitance is large, minority carriers are injected from the diffusion layer 53 into the substrate 51. The minority carriers partially reach the depletion layer 55 and are accelerated. Because the electric field in the depletion layer 55 is high, the minority carriers reaching there receive great energy. The high-energy minority carriers hit the silicon crystals in the substrate 51 and generate electron-hole pairs, and hence multiply the carriers. The result is that the breakdown current is largely increased. The breakdown current causes a great amount of thermal energy to be generated at the junction face of diffusion layer 52. This thermal energy destroys the junction face. Therefore, the gate protecting circuit is damaged and the withstanding voltage of the device is considerably reduced.

Figure 7:
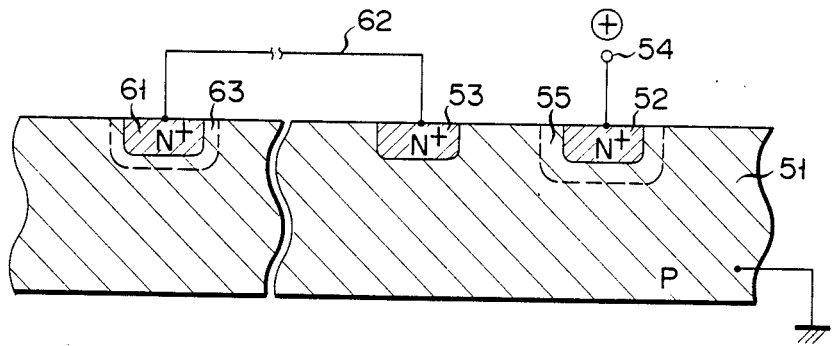
FIG. 7 shows a cross sectional view of a MOS type semiconductor device when two separate internal circuits are interconnected.

Next consider a case where the diffusion layer 53 of the internal circuit is connected to a diffusion layer 61 of another internal circuit by means of a conductive layer 62 made of aluminum, for example, which is indicated by a single line in FIG. 7. Here, when a positive surge voltage is applied to the input terminal 54, the diffusion layer 52 is inversely biased and destroyed. Then, the potential of that part of substrate 51 which is near the diffusion layer 52 rises to forwardly bias the diffusion layer 53 in the near internal circuits as described above. In this case, when the capacitance of the diffusion layer 53 is small, it is supplied with minority carriers from diffusion layer 61, because diffusion layer 53 is connected to the diffusion layer 61. When the potential of the diffusion layer 53 rises, the potential of the diffusion layer 61 also rises. However, the substrate potential near diffusion layer 61 does not vary, and diffusion layer 61 is destroyed. The result is to supply the minority carriers from diffusion layer 61 to diffusion layer 53, and to inject the minority carriers into the silicon substrate 51. The minority carriers partially reach the depletion layer 55 of diffusion layer 52, to cause the multiplication of the carriers. The multiplied carriers generate a great amount of heat at the junction of the diffusion layer 52. This leads to the reduction of the withstanding voltage of the device.

Although the destruction mechanism has been described above using the case that the semiconductor device receives a positive surge voltage, this mechanism also applies to the case where a negative surge voltage is applied. In this case, the bias state is opposite to that described above. Specifically, when a negative surge voltage is applied, the diffusion layer of the internal circuit is reverse-biased and destroyed. The configurations shown in FIGS. 6 and 7 are typical because the diffusion layer of the internal circuit is generally connected to a power source or another internal diffusion layer for circuit formation.

As seen from the foregoing description, when a diffusion layer is located close to another diffusion layer which receives a surge voltage, the second diffusion layer is inversely biased and destroyed, leading to a great reduction of the withstanding voltage of the device. In other words, the withstanding voltage depends largely on the distance between the diffusion layers of the gate protecting circuit and the diffusion layers of the internal circuit or other, adjacent, gate protecting circuit.

The present inventors discovered that in the embodiment of FIGS. 3 to 5, if the distances D2 and D3 between the diffusion layers 24 to 28 in the internal circuit 22 and the diffusion layer $29_1$ of the gate protecting circuit $23_1$ are set at values at least ten times the minimum distance between the adjacent diffusion layers 24 to 28, i.e., $D_1$, the destruction mechanism is defeated. This distance (D2 and D3) must be such that it prevents the minority carriers emitted from the diffusion layers 24 to 28 from reaching the depletion layer caused by the impression of the surge voltage on the diffusion layer $29_1$ in the gate protecting circuit $23_1$. With such a selection of the distances, if the minority carriers are injected from the diffusion layers 24 to 28 into the silicon substrate, most of the minority carriers are recombined in the silicon substrate before reaching the gate protecting circuit 23, thereby increasing the withstanding voltage of the device greatly. The requirements for the selection of these distances, as described above, are true for other gate protecting circuits as well.

To determine how the distances discussed influence the withstanding voltage, the variation of the withstanding voltage was measured against the distance between the diffusion layers of the gate protecting circuit and the internal circuit. FIG. 8 shows the result of the destruction tests carried out using electric charges stored in a capacitor of 200 pF. On the abscissa is plotted the withstanding voltage or tolerance against electro-static discharge and on the ordinate is plotted a distance (corresponding to D2 shown in FIG. 5) between the input diffusion layer of the gate protecting circuit and the diffusion layer of the internal circuit. The graph of FIG. 8 demonstrates several facts. The withstanding voltage depends largely on the distance, and its increase is substantially proportional to the increase in distance, up to about 100 μm. A withstanding voltage of 400 V at a distance of 30 μm is satisfactory in practical use. In the range from about 90 μm to 100 μm, the withstanding voltage is approximately 1000 V. As seen from FIG. 8, 30 μm is the minimum required distance, and 150 μm protects against a surge problem even if variations in the resistivity of the substrate and diffusion length of minority carriers are taken into account, both of which arise during the wafer manufacturing process. The input section diffusion layer $29_1C$ is the region to which a surge voltage is first applied, and, therefore, it receives a voltage higher than that applied to the resistor diffusion layer $29_1R$, and it also has a high current density. Though the resistor diffusion layer $29_1R$ is less influenced by the surge voltage than the input section diffusion layer $29_1C$, the resistor diffusion layer $29_1R$ is still influenced by the surge voltage. To avoid this influence, it is necessary to set a distance D3 between the resistor diffusion layer and the diffusion layer of the internal circuit to be 20 μm or more.

In the above embodiment, the distances between the diffusion layers of the gate protecting circuits $23_1$, $23_2$, . . . and the diffusion layers in the internal circuit 22 or adjacent gate protecting circuit are substantially equal to each other. This is done so that the withstanding voltages in those circuit pairs are set within a narrow range of the possible variation of the voltages, for the purpose of improving the withstanding voltage of the MOS type semiconductor device as a whole.

It should be understood that the present invention is not limited to the above-described embodiment. For example, any type of gate protecting circuit can be employed in implementing the present invention, if it has a structure containing the diffusion layer.

As seen from the foregoing description, the present invention has successfully provided a microfabricated MOS type semi-conductor device with a gate protecting circuit having a high withstanding voltage.

What is claimed is:

1. A MOS type semiconductor device of three semiconductor layer structure comprising:

a first semiconductor layer of a first conductivity type comprising a semiconductor substrate;

a second semiconductor layer of a second conductivity type comprising an impurity diffusion layer of a second conductivity type formed in said first semiconductor layer, said impurity diffusion layer forming an element of a gate-protecting circuit and comprising an input section diffusion layer of said second conductivity type of said gate-protecting circuit, said input section diffusion layer being connected to an external input terminal to which an input voltage is applied; and a third semiconductor layer of said second conductivity type comprising a plurality of impurity diffusion layers of said second conductivity type formed in said first semiconductor layer, said plural impurity diffusion layers forming elements of a circuit other than said gate-protecting circuit, said plural impurity diffusion layers of said other circuit being separated from each other by at least a first predetermined minimum distance, said plural impurity diffusion layers of said third semiconductor layer being separated from said input section diffusion layer of said second semiconductor layer by a second distance, the second distance being determined to have a value of ten times or more than said first predetermined minimum distance for protecting said gate-protecting circuit from destruction in response to a surge voltage applied to said gate-protecting circuit through said external input terminal.

2. A MOS type semiconductor device according to claim 1, wherein said other circuit includes an internal circuit whose input section is protected by said gate protecting circuit.

3. A MOS type semiconductor device according to claim 2, wherein said second distance between said input section layer and the diffusion layers in said other circuit is 30 μm or more.

4. A MOS type semiconductor device according to claim 2, wherein said second distance between said input section layer and the diffusion layers in said other circuit is 150 μm or less.

5. A MOS type semiconductor device according to claim 2, wherein said impurity diffusion layer in said gate protecting circuit is composed of said input section layer and a resistive element layer, and a third distance between said resistive element layer and the diffusion layers in said other circuit is 150 μm or less.

6. A MOS type semiconductor device according to claim 1, wherein said second distance between said input section layer and the diffusion layers in said other circuit is 30 μm or more.

7. A MOS type semiconductor device according to claim 1, wherein said second distance between said input section layer and the diffusion layers in said other circuit is 150 μm or less.

8. A MOS type semiconductor device according to claim 1, wherein said impurity diffusion layer in said gate protecting circuit is composed of said input section layer and a resistive element layer, and a third distance between said resistive element layer and the diffusion layers in said other circuit is 20 μm or more.

9. A MOS type semiconductor device according to claim 2, wherein said impurity diffusion layer in said gate protecting circuit is composed of said input section layer and a resistive element layer, and a third distance between said resistive element layer and the diffusion layers in said other circuit is 20 μm or more.

10. A MOS type semiconductor device according to claim 1, wherein said impurity diffusion layer in said gate protecting circuit is composed of said input section layer and a resistive element layer, and a third distance between said resistive element layer and the diffusion layers in said other circuit is 150 μm or less.

11. A MOS type semiconductor device according to claim 1, wherein said plural impurity diffusion layers are applied with a fixed potential when the MOS type semiconductor device operates.

12. A MOS type semicondcutor device of three semiconductor layer structure comprising:

a first semiconductor layer of a first conductivity type comprising a semiconductor substrate;

a second semiconductor layer of a second conductivity type comprising a first plurality of impurity diffusion layers of a second conductivity type, formed in said first semiconductor layer, said plural impurity diffusion layers forming elemnts of gate-protecting circuits and comprising input section diffusion layers of said second conductivity type of said gate-protecting circuits, said input section diffusion layers being connected to external input terminals to which input voltages are applied; and a third semiconductor layer of said second conductivity type comprising a plurality of second impurity diffusion layers of second conductivity type formed in said first semiconductor layer, said second plural impurity diffusion layers forming elements of a circuit other than said gate-protecting circuits, said second plural impurity diffusion layers of said other circuit being separated from each other by at least a first predetermined minimum distance, said second plural diffusion layers of said third semiconductor layer being separated from said input section diffusion layers of said second semiconductor layer by second distances, the second distances being determined to have a valve ten times or more than said first predetermined minimum distance for protecting said gate-protecting circuits from destruction in response to surge voltages applied to said gate-protecting circuits through said external input terminals.

13. A MOS type semiconductor device according to claim 12, wherein said second plural impurity diffusion layers are applied with a fixed potential when the MOS type semiconductor device operates.

14. A MOS type semiconductor device according to claim 12, wherein said second distances are 150 μm or less.

15. A MOS type semiconductor device according to claim 12, wherein said second distances are 30 μm or more.

16. A MOS type semiconductor device according to claim 12, wherein distances between said diffusion layers of adjacent two of said gate protecting circuits are substantially equal to said second distances.

17. A MOS type semiconductor device according to claim 16, wherein said distances between said diffusion layers of two adjacent gate protecting circuits are 30 μm or more.

18. A MOS type semiconductor device according to claim 16, wherein said distances between said diffusion layers of two adjacent gate protecting circuits are 30 μm or more.

* * * * *